United States Patent
Ishihara

(10) Patent No.: US 11,973,347 B2
(45) Date of Patent: Apr. 30, 2024

(54) STORAGE BATTERY SYSTEM AND METHOD FOR SUPPRESSING FLUCTUATION IN FREQUENCY OF AC POWER SYSTEM

(71) Applicant: Mitsubishi Electric Corporation, Tokyo (JP)

(72) Inventor: Hiroki Ishihara, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 124 days.

(21) Appl. No.: 17/795,542

(22) PCT Filed: Mar. 30, 2020

(86) PCT No.: PCT/JP2020/014491
§ 371 (c)(1),
(2) Date: Jul. 27, 2022

(87) PCT Pub. No.: WO2021/199125
PCT Pub. Date: Oct. 7, 2021

(65) Prior Publication Data
US 2023/0075738 A1    Mar. 9, 2023

(51) Int. Cl.
*H02J 3/32* (2006.01)
*G01R 23/15* (2006.01)
(Continued)

(52) U.S. Cl.
CPC .......... *H02J 3/32* (2013.01); *G01R 23/15* (2013.01); *H01M 10/425* (2013.01);
(Continued)

(58) Field of Classification Search
CPC ........................................... H02J 3/32
See application file for complete search history.

(56) References Cited

U.S. PATENT DOCUMENTS

| | | |
|---|---|---|
| 2013/0076131 A1 | 3/2013 | Kaku |
| 2014/0239913 A1 | 8/2014 | Kudo et al. |
| 2015/0357854 A1 | 12/2015 | Watanabe |

FOREIGN PATENT DOCUMENTS

| | | | |
|---|---|---|---|
| EP | 3148037 A1 * | 3/2017 | ............ H02J 1/102 |
| JP | 2011-167014 A | 8/2011 | |

(Continued)

OTHER PUBLICATIONS

International Search Report and Written Opinion dated Jun. 23, 2020, received for PCT Application PCT/JP2020/014491, filed on Mar. 30, 2020, 11 pages including English Translation.

(Continued)

*Primary Examiner* — Patrick O Neill
(74) *Attorney, Agent, or Firm* — XSENSUS LLP

(57) ABSTRACT

A storage battery system includes a first storage battery unit. First storage battery unit includes a first converter that converts alternating current and direct current, a first storage battery, and a first controller that controls first converter, and first storage battery unit is interconnected to a system for supplying power. The first controller detects a frequency of the system, and controls first converter such that first storage battery outputs constant active power to the system on the basis of the frequency of the system falling below a first threshold value.

20 Claims, 10 Drawing Sheets

(51) Int. Cl.
*H01M 10/42* (2006.01)
*H02J 3/38* (2006.01)
*H02J 7/00* (2006.01)

(52) U.S. Cl.
CPC ............ *H02J 3/381* (2013.01); *H02J 7/0013* (2013.01); *H02J 7/0063* (2013.01); *H02J 7/00712* (2020.01); *H01M 2010/4271* (2013.01); *H02J 2207/20* (2020.01)

(56) References Cited

FOREIGN PATENT DOCUMENTS

| | | | |
|---|---|---|---|
| JP | 2012-125019 A | 6/2012 | |
| JP | 2013-153648 A | 8/2013 | |
| JP | 2016-15875 A | 1/2016 | |
| JP | 6232899 B2 | 11/2017 | |
| JP | 2019-161845 A | 9/2019 | |
| JP | 2020-25399 A | 2/2020 | |
| WO | 2012/137516 A1 | 10/2012 | |

OTHER PUBLICATIONS

Notice of Reasons for Refusal dated Dec. 8, 2020, received for JP Application 2020-547020, 14 pages including English Translation.

\* cited by examiner

STORAGE BATTERY SYSTEM AND METHOD FOR SUPPRESSING FLUCTUATION IN FREQUENCY OF AC POWER SYSTEM

CROSS-REFERENCE TO RELATED APPLICATION

The present application is based on PCT filing PCT/JP2020/014491, filed Mar. 30, 2020, the entire contents of which are incorporated herein by reference.

TECHNICAL FIELD

The present disclosure generally relates to a storage battery system, and particularly relates to control for stabilizing a system in the storage battery system.

BACKGROUND ART

In recent years, then has been increasing utilization of renewable energy, such as wind power generation, geothermal power generation, and solar power generation. As such renewable energy becomes widespread, it is expected that the number of power generation facilities using a rotary machine (turbine), such as thermal power generation, will decrease. When the number of rotary machines connected to a power system decreases, inertia of the power system decreases. As a result, there is a possibility that a frequency of the power system sharply decreases due to a disconnected power supply at time of disaster.

The sharp decrease in the frequency induces, for example, simultaneous disintegration of renewable energy interconnected to the system, and may greatly impair a balance between power demand and power supply. Such a phenomenon continuing in a chained manner may lead to a blackout which disconnects all power supplies in the worst case. For this reason, there is a demand for a technique for suppressing a rapid fluctuation in the frequency of the power system due to a decrease in the number of rotary machines.

Regarding a technique for suppressing a fluctuation in the frequency, for example, Japanese Patent Laying-Open No. 2016-015875 (PTL 1) discloses a frequency control apparatus "including segmenting a range from a reference frequency to a lower limit frequency or an upper limit frequency into a plurality of frequency ranges in accordance with a number of a plurality of storage battery systems, detecting a current frequency, and controlling the plurality of storage battery systems so as to cause more storage battery systems to discharge to a power system or charge power supplied from the power system as the frequency range including the current frequency among the plurality of frequency ranges becomes farther apart from the reference frequency" (see ABSTRACT).

CITATION LIST

Patent Literature

PTL 1: Japanese Patent Laying-Open No. 2016-015875

SUMMARY OF INVENTION

Technical Problem

In the technique disclosed in PTL 1, there is a possibility that the frequency of the power system vibrates or diverges when the storage battery outputs active power. Therefore, there is a need for a technique for suppressing a fluctuation in the frequency of the power system without vibrating or diverging the frequency of the power system.

The present disclosure has been made in view of the background described above, and an object of the present disclosure in one aspect is to provide a technique for suppressing a fluctuation in a frequency of a power system without vibrating or diverging the frequency of the power system.

Solution to Problem

A storage battery system according to an embodiment includes a first storage battery unit. The first storage battery unit includes a first converter that converts alternating current and direct current, a first storage battery, and a first controller that controls the first converter, and the first storage battery unit is interconnected to a system for supplying power. The first controller detects a frequency of the system, and controls the first converter such that the first storage battery outputs constant active power to the system on the basis of the frequency of the system falling below a first threshold value.

Advantageous Effects of Invention

An embodiment can suppress a fluctuation in the frequency of a power system without vibrating or diverging the frequency of the power system.

The above and other objects, features, aspects and advantages of the present disclosure will become apparent from the following detailed description of the present disclosure to be understood in conjunction with the accompanying drawings.

DESCRIPTION OF EMBODIMENTS

Figure 1:
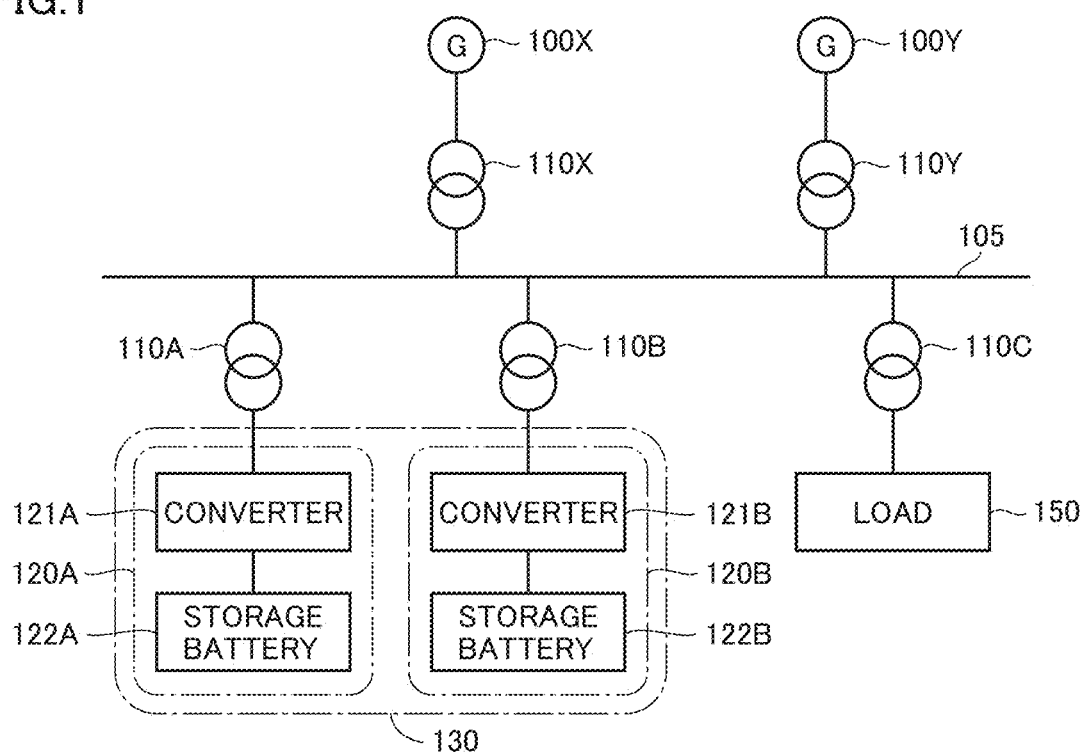
FIG. 1 is a diagram illustrating an example of a system 105 to which a storage battery system 130 according to an embodiment is interconnected.

Hereinafter, an embodiment of technical ideas of the present disclosure will be described with reference to the drawings. In the following description, the same parts are designated by the same reference signs. Names and functions of such parts are the same. Therefore, the detailed description of the parts will not be repeated. In the following description, when there are a plurality of configurations such as the same or the same type of devices in the drawings, the configurations may be expressed as "configuration 10A and configurations 10B to 10Z". When collectively referred to, the configurations may be expressed as "configuration 10".

<A. Outline of Storage Battery System>

FIG. 1 is a diagram illustrating an example of a system 105 to which a storage battery system 130 according to the present embodiment is interconnected. Each configuration of storage battery system 130 and an outline of an operation of storage battery system 130 will be described with reference to FIG. 1. Here, system 105 is an alternating current power system.

(A-1. Elements Interconnected to Power System)

A generator 100 is interconnected to system 105 via a transformer 110. As an example, generator 100 includes a rotary machine that rotates by steam, gas, hydraulic power, or the like and converts rotational energy into electric energy. Generator 100 supplies electric energy generated by rotary machine to system 105 via transformer 110.

A part of the energy supplied to system 105 by generator 100 is charged in a storage battery 122 in storage battery system 130. The remainder of the energy supplied to system 105 by generator 100 is consumed by a load 150.

The electric energy per unit time is referred to as power, and a frequency of system 105 is kept constant when a balance between demand and supply of the power is balanced. When power demand exceeds power supply, the frequency of system 105 decreases, and when the power supply exceeds the power demand, the frequency of the system increases.

In general, the generator is provided with a speed governor, and the generator controls a rotation speed of the rotary machine by the speed governor to maintain the balance between the power demand and the power supply and suppress a fluctuation in the frequency of system 105.

In one aspect, generator 100 interconnected to system 105 may include a rotary machine of a thermal power generator, a hydraulic power generator, a nuclear power generator, or the like. In another aspect, generator 100 interconnected to system 105 may be a generator using renewable energy, such as a wind power generator, a solar power generator, or a geothermal power generator. In still another aspect, generator 100 interconnected to system 105 may be a combination of the above.

In the example in FIG. 1, the number of generators 100 interconnected to system 105 is two, but the number is an example, and the embodiment is not limited to this number. Storage battery system 130 according to the present embodiment can be used in system 105 to which an arbitrary number of generators 100 are interconnected.

Transformer 110 converts a voltage between power lines. As an example, a transformer 110C converts a voltage between a generator 100X and system 105. As another example, a transformer 110A converts a voltage between a storage battery unit 120A and system 105. Transformer 110 can be of any size and withstand any voltage depending on a place to be used, application, and the like. For example, transformer 100X before generator 110X can be larger in scale than transformer 110A before storage battery unit 120A. In one aspect, transformer 110 may include either or both of an AC/AC converter for performing an alternating current (AC) transformation or/and a DC/AC (AC/DC) converter for converting direct current (DC) and AC.

Storage battery system 130 includes one or more storage battery units 120. In the example illustrated in FIG. 1, storage battery system 130 includes storage battery unit 120A and a storage battery unit 120B. Storage battery unit 120A is interconnected to system 105 via transformer 11 A. Storage battery unit 120B is interconnected to system 105 via a transformer 110B. In the example in FIG. 1, the number of storage battery units 120 included in storage battery system 130 is two, but the number is an example, and the embodiment is not limited to this number. In one aspect, storage battery system 130 can include any number of storage battery units 120. In another aspect, when storage battery system 130 includes a plurality of storage battery units 120, storage battery units 120 do not need to be close to each other as illustrated in FIG. 1.

Storage battery unit 120 charges storage battery 122 with a part of the power supplied to system 105. When the frequency of system 105 decreases, storage battery unit 120 outputs the power charged in storage battery 122 to system 105. Storage battery unit 120 includes a converter 121 and storage battery 122.

Converter 121 converts AC and DC. In general, system 105 is an AC power line, but storage battery 122 needs to be connected to a DC power line. Therefore, converter 121 performs mutual conversion of AC and DC between system 105 and storage battery 122. In one aspect, when the voltage supplied to system 105 is sufficiently low, converter 121 may be directly interconnected to system 105 without transformer 110.

Storage battery 122 charges the power supplied from system 105, and outputs the stored power to system 105 when generator 100 is stopped, for example. In one aspect, storage battery 122 may be any battery such as a sodium sulfur battery, a lithium ion battery, a nickel hydrogen battery, a lead storage battery, or a redox flow battery. In another aspect, storage battery 122 may include a power storage device capable of storing and releasing electric energy, such as a flywheel or a capacitor including an electric double layer capacitor or a lithium ion capacitor. In still another aspect, storage battery 122 may be a combination of the above.

Load 150 includes any load that consumes power, such as a factory, a general residence, or an office. Specifically, load 150 corresponds to electrical equipment in such facilities.

(A-2. Basic Operation of Storage Battery System)

In the example illustrated in FIG. 1, when the power supply from some or all of generators 100 instantaneously decreases or becomes zero due to a large-scale disaster or a failure of equipment, the power demand exceeds the power supply, and thus the frequency of system 105 rapidly decreases. In particular, the less generators and lower inertia the power system has, the more sharply the frequency of the power system decreases. The speed governor cannot suppress the fluctuation in the frequency of the system occurring in such a short time. Therefore, each of storage battery unit 120A and storage battery unit 120B included in storage battery system 130 operates as follows to suppress a decrease in the frequency of the power system.

Storage battery unit 120A outputs constant active power on the basis of the frequency of system 105 being lower than a first threshold value set in advance. Specifically, in a first step, a converter 121A detects the voltage and frequency of system 105 by a frequency detector (not shown). At that time, converter 121A may detect the voltage and frequency of the power line of storage battery unit 120A of transformer 110A by the frequency detector.

In a second step, converter 121A determines whether the frequency of system 105 is lower than the first threshold value set in advance. When determining that the frequency of system 105 is lower than the first threshold value, converter 121A switches a circuit inside converter 121A such that constant active power is output from a storage battery 122A toward system 105. Otherwise, converter 121A maintains the circuit inside converter 121A such that storage battery 122A is charged.

As described above, since the power output from storage battery 122A is always constant, the power output from storage battery 122A does not change even when the frequency of system 105 changes drastically. Therefore, storage battery system 130 can suppress vibration and divergence of the frequency of system 105.

Storage battery unit 120B outputs power that fluctuates on the basis of an amount of change in the frequency of system 105 when the frequency of system 105 greatly decreases to such an extent as not to be suppressed only by storage battery unit 120A. In other words, storage battery unit 120B outputs the power that fluctuates in accordance with the amount of change in the frequency of system 105 on the basis of the frequency of system 105 being lower than a second threshold value lower than the first threshold value.

Specifically, in a third step, converter 121B detects the voltage and frequency of system 105 by the frequency detector (not shown). At that time, converter 121B may detect the voltage and frequency of the power line of storage battery unit 120B of transformer 110B by the frequency detector. Note that processing of the third step may be executed at least before processing of the second step.

In a fourth step, converter 121B determines whether the frequency of system 105 is lower than the second threshold value set in advance. When determining that the frequency of system 105 is lower than the second threshold value, converter 121B switches a circuit inside converter 121B such that variable active power is output from storage battery 122B toward system 105. Otherwise, converter 121B maintains the circuit inside converter 121B such that storage battery 122B is charged.

In one aspect, storage battery unit 120B may output the active power proportional to a deviation between the frequency of system 105 and a reference frequency. In another aspect, storage battery unit 120B may output the active power based on a value obtained by proportional integration of the deviation between the frequency of system 105 and the reference frequency. Here, the "reference frequency" is, for example, a representative value of the frequency in a normal state in system 105.

As described above, when the frequency of system 105 decreases only within a certain range (when the frequency of system 105 decreases to less than the first threshold value and greater than or equal to the second threshold value), only storage battery unit 120A outputs constant active power. When the frequency of system 105 decreases beyond the certain range (when the frequency of system 105 decreases to less than the second threshold value), storage battery unit 120A outputs constant active power and storage battery unit 120B also outputs active power that changes on the basis of the frequency of system 105 and the reference frequency to suppress a sharp decrease in the frequency of system 105.

When storage battery system 130 recovers the frequency of system 105 to around the reference frequency and storage battery unit 120B continues to output active power, the frequency of system 105 may vibrate or diverge. This is because when the frequency of system 105 rises and falls around the reference frequency, the active power output from storage battery unit 120B also rises and falls in proportion to the frequency of system 105. Therefore, storage battery unit 120B suppresses vibration or divergence of the frequency of system 105 by stopping the output of the active power before storage battery unit 120A does.

Specifically, in a fifth step, converter 121B determines whether the frequency of system 105 is greater than or equal to the second threshold value. When determining that the frequency of system 105 is greater than or equal to the second threshold value, converter 121B switches the circuit inside converter 121B to block the output of active power from storage battery 122B. Otherwise, converter 121B maintains the circuit inside converter 121B such that active power is output from storage battery 122B. In one aspect, converter 121B may switch the circuit inside converter 121B so as to gradually decrease and stop the output of active power from storage battery 122B.

In a sixth step, converter 121A determines whether the frequency of system 105 is greater than or equal to a third threshold value. The third threshold value is a threshold value set in advance, and is desirably greater than or equal to the first threshold value. When determining that the frequency of system 105 is greater than or equal to the third threshold value, converter 121A switches the circuit inside converter 121A to block the output of active power from storage battery 122A. Otherwise, converter 121A maintains the circuit inside converter 121A such that active power is output from storage battery 122A.

As described above, storage battery unit 120B that outputs active power that fluctuates on the basis of the change in the frequency of system 105 stops power supply to system 105 before storage battery unit 120A, and thus the frequency of system 105 can be suppressed from vibrating or diverging around the reference frequency.

In the following description, storage battery unit 120 having a function of outputting constant active power regardless of the change in the frequency of system 105 is referred to as "storage battery unit 120A". In the following description, storage battery unit 120 having a function of outputting active power that fluctuates on the basis of the change in the frequency of system 105 is referred to as "storage battery unit 1201".

<B. Configuration of Storage Battery Unit>

Figure 2:
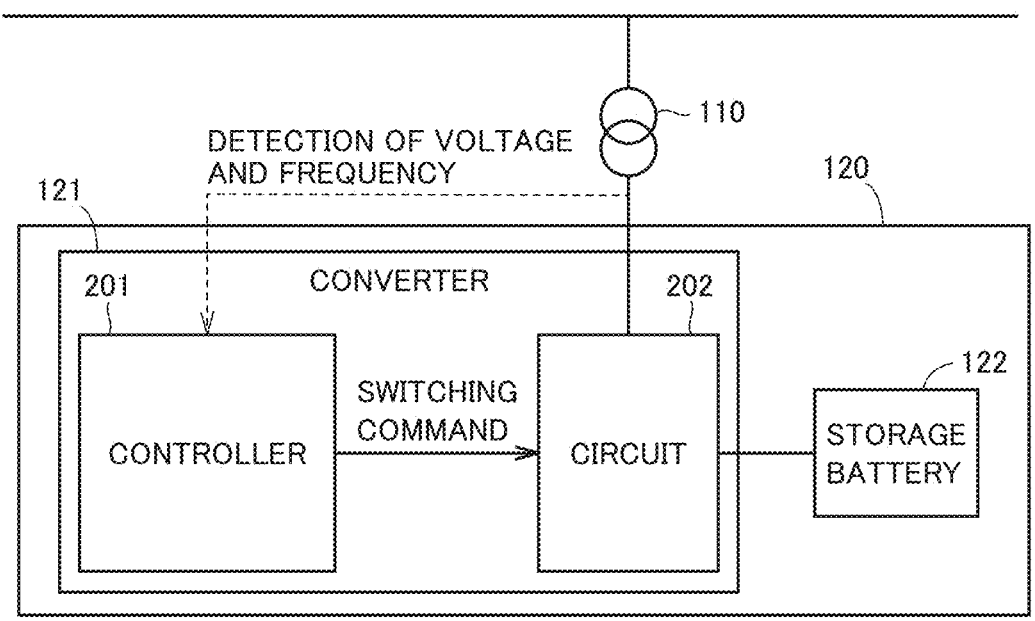
FIG. 2 is an example of a configuration of a converter 121.

FIG. 2 is an example of a configuration of converter 121. Converter 121 includes a controller 201 and a circuit 202. Controller 201 controls converter 121 as a whole. In one aspect, controller 201 may be implemented by a combination of hardware and software. In another aspect, controller 201 may include an application specific integrated circuit (ASIC), a field-programmable gate array (FPGA), a general-purpose processor, a module of a plurality of components, a printed circuit board (PCB), or the like.

In a case where controller 201 executes software, controller 201 includes a central processing unit (CPU) (not shown) and a random access memory (RAM) (not shown). Controller 201 may further include a read only memory (ROM) (not shown).

The CPU executes or refers to various programs and data read into the RAM. The RAM stores a program executed by the CPU and the data referred to by the CPU, in one aspect, the RAM may be a dynamic random access memory (DRAM) or a static random access memory (SRAM).

The ROM is a nonvolatile memory, and may store the program executed by the CPU. In this case, the CPU executes the program read from the ROM to the RAM. In one aspect, the ROM may be an erasable programmable read only memory (EPROM), an electrically erasable programmable read-only memory (EEPROM), or a flash memory.

Controller 201 may further include a storage (not shown) for storing programs, data, and the like. In one aspect, the storage may be installed outside controller 201.

The storage can store any programs and data that the CPU executes or refers to. In one aspect, the storage may be a hard disk drive (HDD) or a solid state drive (SSD). The CPU can read various programs from the storage into the RAM as necessary and execute the read programs.

Controller 201 detects the voltage and frequency of the power line between transformer 110 and storage battery unit 120 by the frequency detector. Controller 201 can detect the voltage and frequency of system 105 on the basis of the detected frequency. In one aspect, controller 201 may directly detect the voltage and frequency of system 105. In another aspect, the frequency detector may be built in controller 201 or may be provided outside controller 201.

Circuit 202 controls a flow of power between storage battery 122 and system 105. Circuit 202 can include, for example, an inverter (DC/AC converter) and a converter (AC/DC converter). In one aspect, circuit 202 may include a DC/DC converter. In another aspect, circuit 202 may include an AC/AC converter.

Controller 201 outputs a switching command that controls the inverter, the converter, or a peripheral circuit of the inverter and the converter to circuit 202 on the basis of a detection result of the frequency detector. Thus, controller 201 can adjust a direction of the flow of power or an amount of power between storage battery 122 and system 105.

Figure 3:
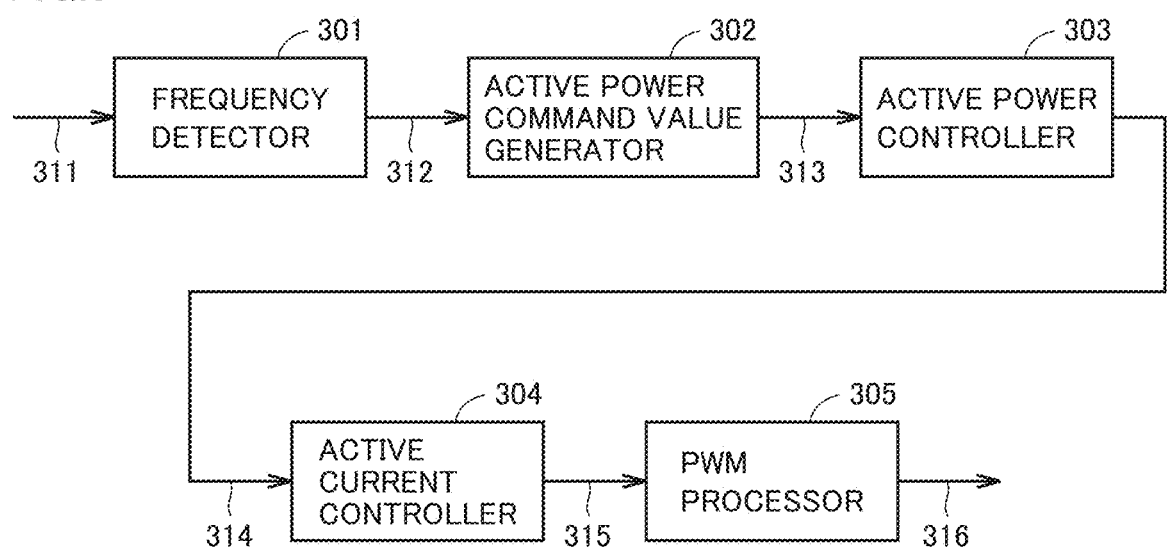
FIG. 3 is a diagram illustrating an example of a flow of data between modules inside a controller 201 in converter 121.

FIG. 3 is a diagram illustrating an example of a flow of the data between the modules inside controller 201 in converter 121. Each configuration illustrated in FIG. 3 may be a program module executed by controller 201, may be hardware incorporated in controller 201, or may be a combination thereof. Some of the configurations may be provided outside controller 201.

A frequency detector 301 detects an interconnection point voltage 311. Frequency detector 301 converts interconnection point voltage 311 into a rotating coordinate system, and at the same time, detects a frequency 312 of the interconnection point. Here, the "interconnection point" is a connection point between storage battery unit 120 and system 105. In other words, the interconnection point refers to a vicinity of transformer 110 between storage battery unit 120 and system 105. Frequency detector 301 outputs frequency 312 of the interconnection point to active power command value generator 302.

Active power command value generator 302 generates an active power command value 313 in accordance with frequency 312 of the interconnection point having been input. Active power command value generator 302 outputs active power command value 313 having been generated to an active power controller 303.

Active power controller 303 generates an active current command value 314 such that active power whose feedback has been detected by controller 201 follows active power command value 313. Active power controller 303 outputs active current command value 314 to an active current controller 304.

Active current controller 304 generates a modulation factor 315 such that active current whose feedback has been detected by controller 201 follows active current command value 314. Active current controller 304 outputs modulation factor 315 to a pulse width modulation (PWM) processor 305.

PWM processor 305 converts modulation factor 315 into an on-off command 316 of each switch included in circuit 202. PWM processor 305 outputs on-off command 316 (switching command) to circuit 202. Each switch of circuit 202 switches on-off operation in accordance with the on-off command generated by controller 201.

Note that the configuration of controller 201 illustrated in FIG. 3 is an example, and an implementation example of controller 201 is not limited to this configuration. In one aspect, controller 201 can include hardware and software for implementing a reactive power control or voltage control function.

<C. Processing Procedure of Storage Battery Unit>

Figure 4:
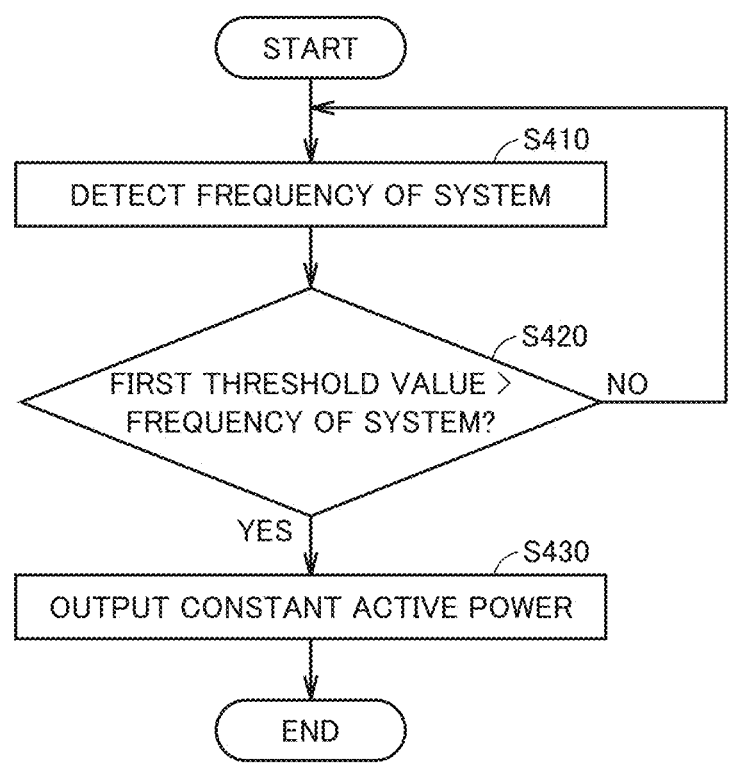
FIG. 4 is a diagram illustrating a first example of an operation procedure of a storage battery unit 120A.

FIG. 4 is a diagram illustrating a first example of the operation procedure of storage battery unit 120A. In one aspect, controller 201 of storage battery unit 120A may read a program for performing processing in FIG. 4 from the ROM or the storage into the RAM and execute the program. In another aspect, a part or all of the processing can be implemented as a combination of circuit elements configured to execute the processing.

In step S410, controller 201 detects the frequency of system 105 by frequency detector 301. In step S420, controller 201 determines whether the detected frequency of system 105 is less than the first threshold value. In one aspect, controller 201 may read data of the first threshold value from the ROM or the storage to the RAM and refer to the data.

When determining that the detected frequency of system 105 is less than the first threshold value (YES in step S420), controller 201 shifts the control to step S430. Otherwise (NO in step S420), controller 201 shifts the control to step 8410.

In step S430, controller 201 outputs a switching command to circuit 202 so as to output constant active power from storage battery 122A to system 105. Circuit 202 turns on or off a switch inside the circuit 202 in response to the input switching command.

Figure 5:
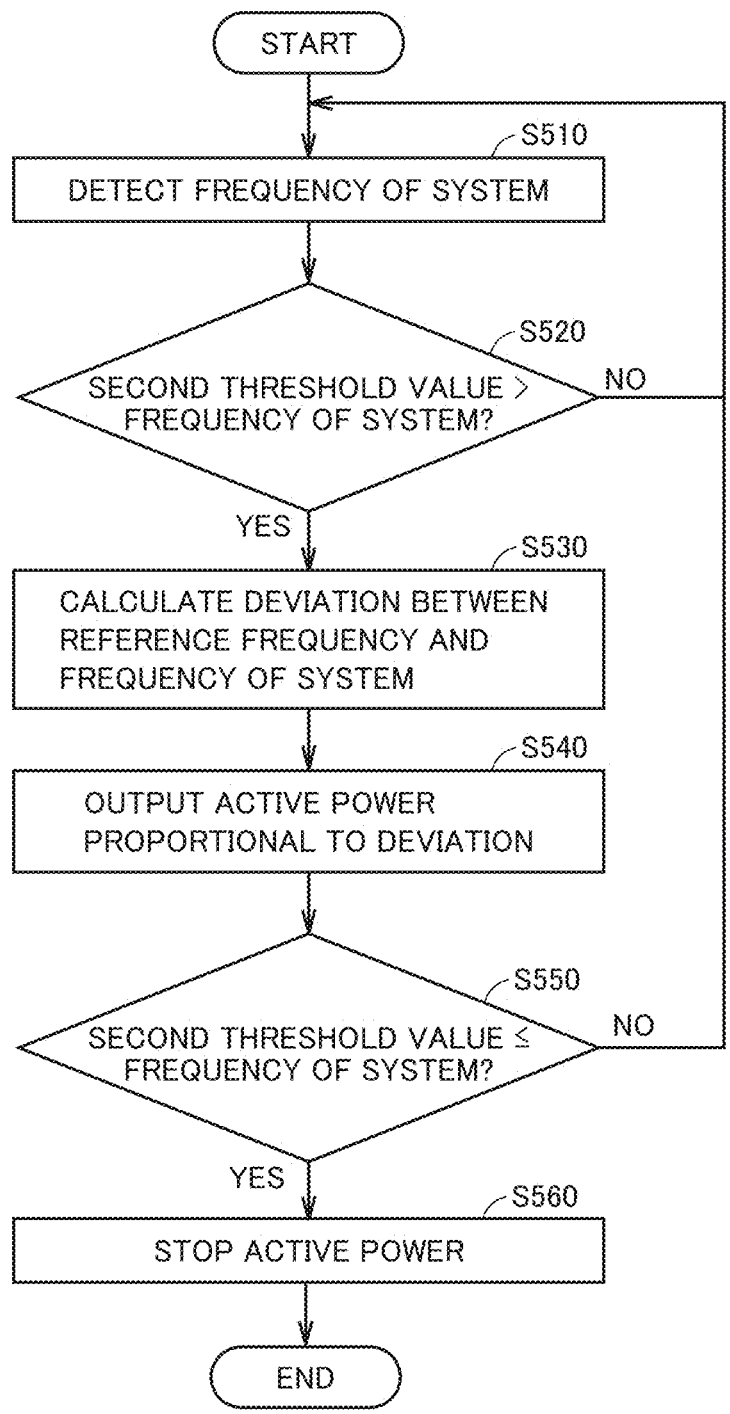
FIG. 5 is a diagram illustrating an example of an operation procedure of a storage battery unit 120B.

FIG. 5 is a diagram illustrating an example of an operation procedure of storage battery unit 120B. In one aspect, controller 201 of storage battery unit 120B may read a program for performing processing in FIG. 5 from the ROM or the storage into the RAM and execute the program. In another aspect, a part or all of the processing can be implemented as a combination of circuit elements configured to execute the processing.

In step S510, controller 201 detects the frequency of system 105 by frequency detector 301. Instep S520, controller 201 determines whether the detected frequency of system 105 is less than the second threshold value. In one aspect, controller 201 may read data of the second threshold value from the ROM or the storage to the RAM and refer to the read data of the second threshold value.

When determining that the detected frequency of system 105 is less than the second threshold value (YES in step S520), controller 201 shifts the control to step S530. Otherwise (NO in step S520), controller 201 shifts the control to step S510.

In step S530, controller 201 calculates a deviation between the reference frequency and the detected frequency of system 105. In step S540, controller 201 outputs a switching command to circuit 202 such that the active power proportional to the deviation between the reference frequency and the detected frequency of system 105 is output from storage battery 122B to system 105. Circuit 202 turns on or off a switch inside the circuit 202 in response to the input switching command. In one aspect, controller 201 outputs a switching command to circuit 202 such that active power based on a value obtained by proportional integration of the deviation between the detected frequency of system 105 and the reference frequency is output from storage battery 122B to system 105.

In step S550, controller 201 determines whether the detected frequency of system 105 is greater than or equal to the second threshold value. In other words, controller 201 determines whether the decreased frequency of system 105 has recovered to the second threshold value or more. When determining that the detected frequency of system 105 is greater than or equal to the second threshold value (YES in step S550), controller 201 shifts the control to step S560. Otherwise (NO in step S550), controller 201 shifts the control to step S510.

In step S560, controller 201 outputs a switching command to circuit 202 so as to stop the output of active power from storage battery 122B to system 105. In one aspect, controller 201 may output a switching command to circuit 202 so as to gradually decrease and stop the output of active power from storage battery 122B to system 105.

Figure 6:
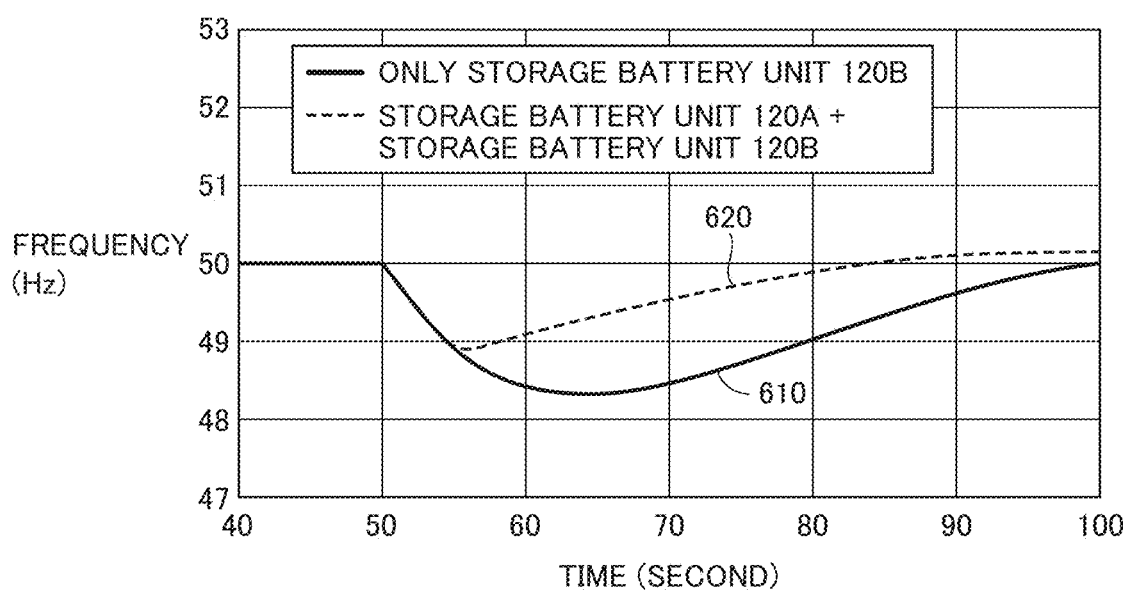
FIG. 6 is a first example of a simulation result of a change in a frequency of system 105 in a case where storage battery system 130 operates when a generator 100 is disconnected and the frequency of system 105 drops.

FIG. 6 is a first example of the simulation result of the change in the frequency of system 105 in a case where storage battery system 130 operates when generator 100 is disconnected and the frequency of system 105 drops. In the example illustrated in FIG. 6, the reference frequency is 50 Hz.

A graph 610 illustrates a change amount of the frequency of system 105 in a case where storage battery system 130 includes only storage battery unit 120B. A graph 620 illustrates a change amount of the frequency of system 105 in a case where storage battery system 130 includes storage battery unit 120A and storage battery unit 120B.

Comparing graph 610 with graph 620, when the frequency of system 105 drops, storage battery unit 120A outputs constant active power to suppress the drop in the frequency of the system more effectively than in a case where only storage battery unit 120B is included. As a result, the frequency of system 105 returns to the reference frequency in a shorter time. This makes it clear that storage battery unit 120A that outputs constant active power is effective in suppressing a decrease in the frequency of system 105.

When there is a plurality of storage battery systems 130, it is assumed that an installation position of each of storage battery systems 130, time required for each of storage battery systems 130 to detect the frequency of system 105, time required for each of storage battery systems 130 to output the active power, and the like are different. If storage battery system 130 includes only storage battery unit 120B that outputs active power depending on the frequency, the frequency of system 105 may vibrate and diverge due to variations in response of each storage battery system 130.

Therefore, storage battery system 130 includes storage battery unit 120A that outputs active power without depending on the frequency, and thus can suppress occurrence of vibration and divergence of the frequency of system 105 and stabilize system 105.

For example, after the decrease in the frequency of system 105 is suppressed by the output of the active power by storage battery unit 120A, storage battery unit 120B outputs the active power corresponding to the frequency of system 105, and thus the balance between the power supply and the power demand in the system can be adjusted. When the frequency of the system 105 becomes greater than or equal to the second threshold value, storage battery unit 120B gradually decreases or stops the output of the active power.

Figure 7:
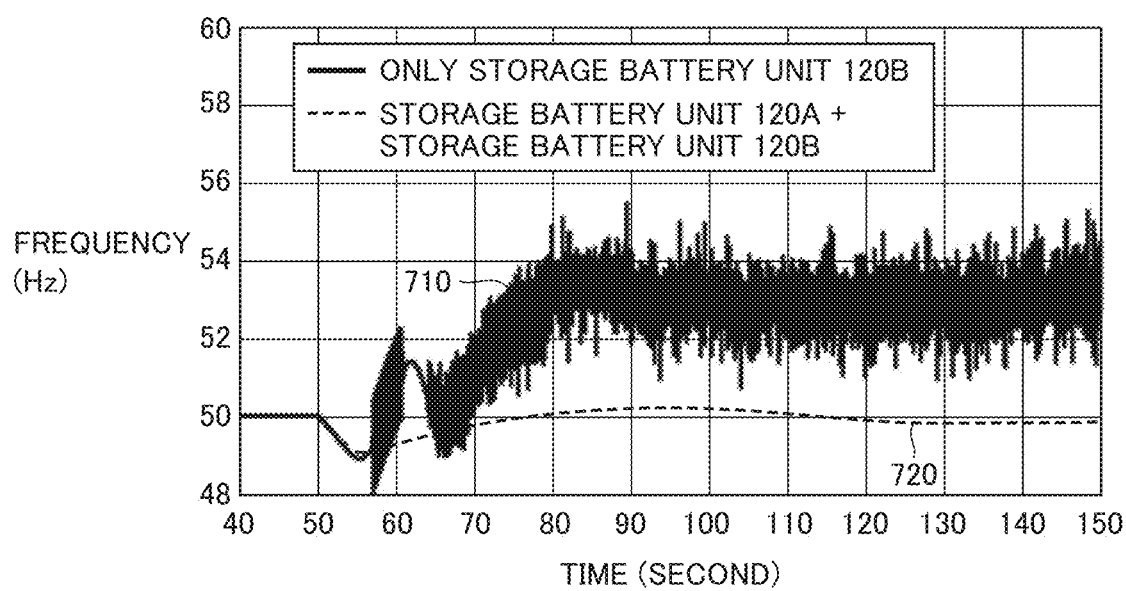
FIG. 7 is a second example of the simulation result of the change in the frequency of system 105 in a case where storage battery system 130 operates when generator 100 is disconnected and the frequency of system 105 drops.

FIG. 7 is a second example of the simulation result of the change in the frequency of system 105 in a case where storage battery system 130 operates when generator 100 is disconnected and the frequency of system 105 drops. In the example shown in FIG. 7, reference frequency is 50 Hz, and storage battery unit 120B outputs active power corresponding to a value obtained by proportional integration of the deviation between the frequency of system 105 and the reference frequency.

A graph 710 illustrates a change amount of the frequency of system 105 in a case where storage battery system 130 includes only storage battery unit 120B. A graph 720 illustrates a change amount of the frequency of system 105 in a case where storage battery system 130 includes storage battery unit 120A and storage battery unit 120B.

Referring to graph 710, it can be seen that in a case where storage battery system 130 includes only storage battery unit 120B, the frequency of system 105 vibrates due to the supply of the active power from storage battery unit 120B to system 105, and the system is in an unstable state.

On the other hand, in a case where storage battery system 130 includes both storage battery unit 120A and storage battery unit 120B, it can be seen that system 105 returns to the reference frequency of system 105 without being in an unstable state due to the supply of the active power from storage battery unit 120A and storage battery unit 120B to system 105. In graph 720, when the frequency of system 105 becomes greater than or equal to the second threshold value, storage battery unit 120B gradually decreases or stops the output of the active power.

As shown in FIGS. 6 and 7, storage battery system 130 includes not only storage battery unit 120B that changes the output of the active power on the basis of the proportion of the deviation between the frequency of system 105 and the reference frequency but also storage battery unit 120A that outputs constant active power. It is therefore possible to suppress the occurrence of vibration and divergence of the frequency of system 105 due to excessive output of the active power and stabilize system 105.

Figure 8:
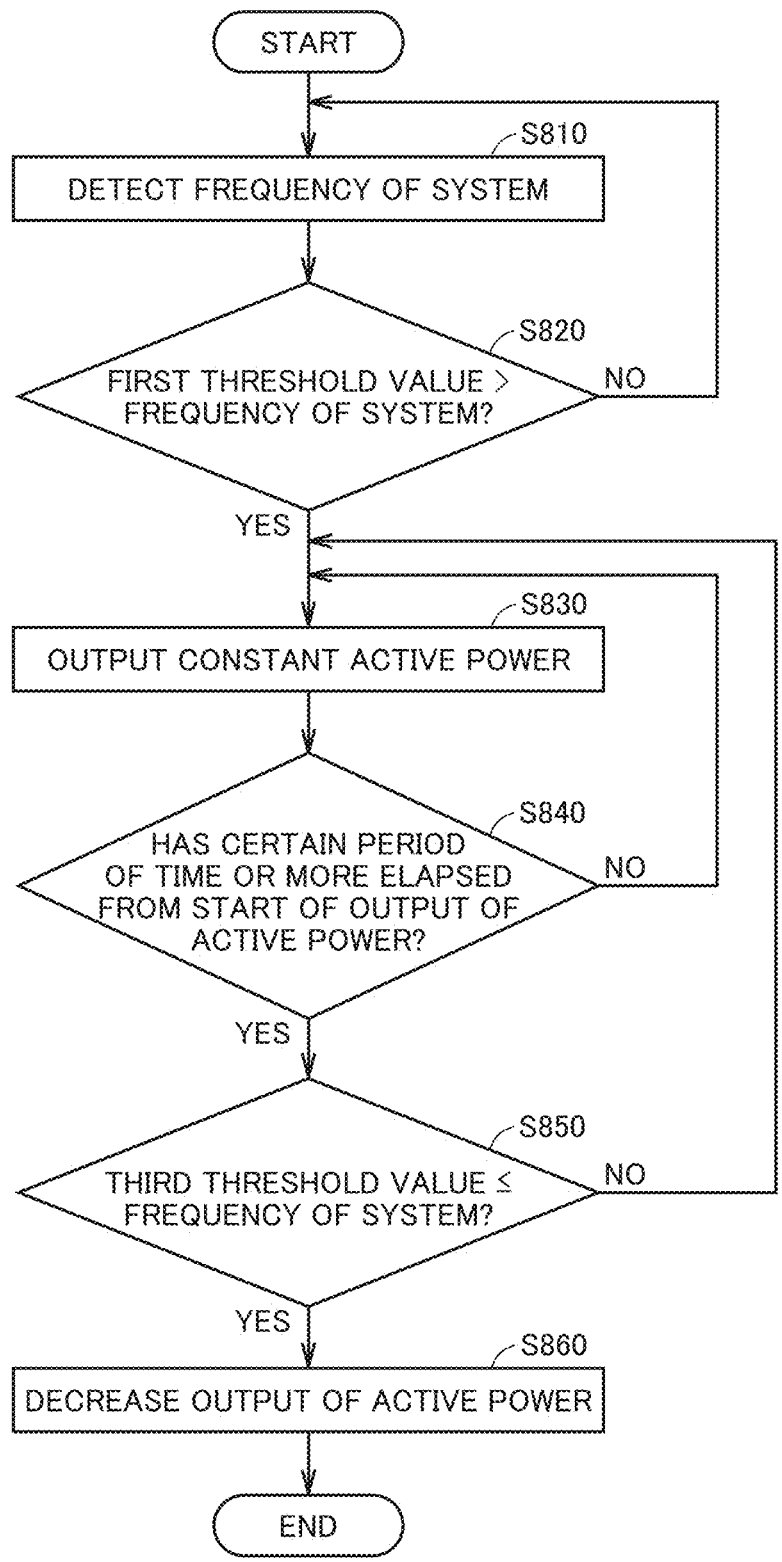
FIG. 8 is a diagram illustrating a second example of the operation procedure of storage battery unit 120A.

FIG. 8 is a diagram illustrating a second example of the operation procedure of storage battery unit 120A. In one aspect, controller 201 of storage battery unit 120A may read a program for performing processing in FIG. 8 from the ROM or the storage into the RAM and execute the program. In another aspect, a part or all of the processing can be implemented as a combination of circuit elements configured to execute the processing.

In step S810, controller 201 detects the frequency of system 105 by frequency detector 301. In step S820, controller 201 determines whether the detected frequency of system 105 is less than the first threshold value.

When determining that the detected frequency of system 105 is less than the first threshold value (YES in step S820), controller 201 shifts the control to step S830. Otherwise (NO in step S820), controller 201 shifts the control to step S810.

In step S830, controller 201 outputs a switching command to circuit 202 so as to output constant active power from storage battery 122A to system 105. Circuit 202 turns on or off a switch inside circuit 202 in response to the input switching command.

In step S840, controller 201 determines whether storage battery 122A has output constant active power for a certain period of time set in advance or more. When determining that storage battery 122A has output constant active power for a certain period of time or more (YES in step S840), controller 201 shifts the control to step S850. Otherwise (NO in step S840), controller 201 shifts the control to step S830.

In step S850, controller 201 determines whether the frequency of system 105 is greater than or equal to the third threshold value. In one aspect, the third threshold value may be a value greater than or equal to the first threshold value. In another aspect, controller 201 may read data of the third threshold value from the ROM or the storage to the RAM and refer to the read data.

When determining that the frequency of system 105 is greater than or equal to the third threshold value (YES in step S850), controller 201 shifts the control to step S860. Otherwise (NO in step S850), controller 201 shifts the control to step S830.

In step S860, controller 201 outputs a switching command to circuit 202 so as to gradually approximate the constant active power output from storage battery 122A to system 105 to zero. Note that it is desirable that the active power gradually approaches zero with a slow time constant regardless of depending on the frequency of system 105. For example, a method of approximating the current output to zero in a ramp state is considered. In this case, although the balance between the demand and the supply of power may be lost due to the decrease in the output of the active power of storage battery unit 120A, the balance between the power demand and the power supply can be adjusted by an increase in the output of storage battery unit 120B and generator 100 connected to the system.

Through the above processing, storage battery unit 120A can decrease the output of the active power before a charge state of storage battery 122A becomes zero. Storage battery unit 120A can suppress a sudden collapse of the balance between the power demand and the power supply by gradually approximating the output of the active power to zero at a slow time constant.

In one aspect, controller 201 may gradually approximate the active power output value to zero only when output time of the active power exceeds a certain period of time and the frequency of system 105 is greater than or equal to the third threshold value. In another aspect, when output time of the active power exceeds a certain period of time, controller 201 may gradually approximate the active power output value to zero whether or not the frequency of system 105 is greater than or equal to the third threshold value.

<D. Other Configurations of Storage Battery System>

Figure 9:
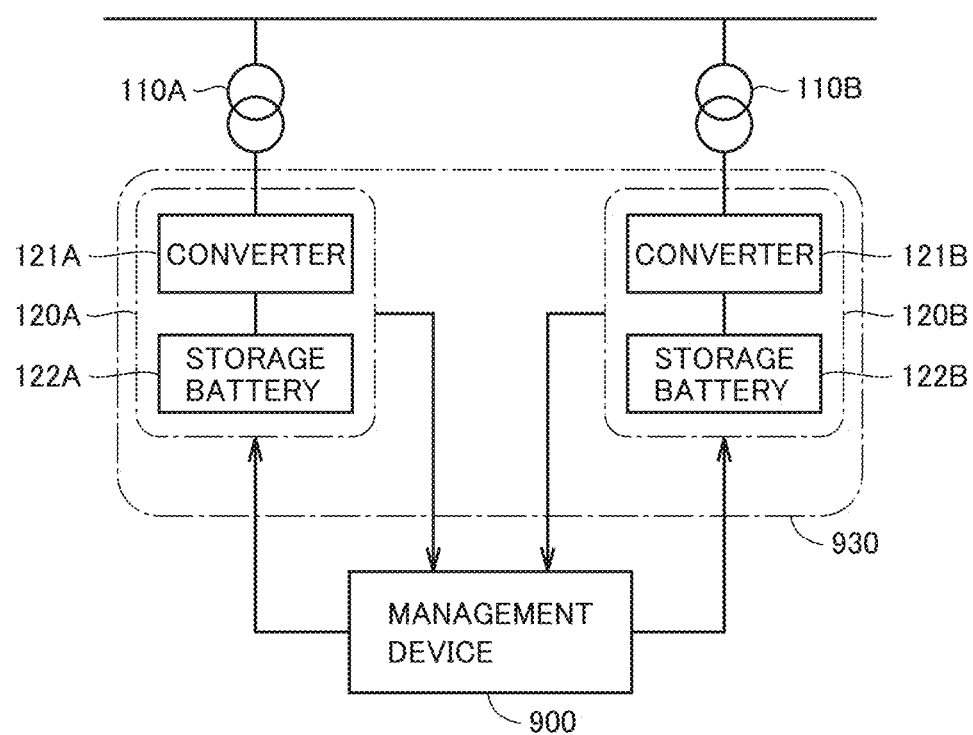
FIG. 9 is a diagram illustrating a second example of a storage battery system according to an embodiment.

FIG. 9 is a diagram illustrating a second example of a storage battery system according to the present embodiment. In the example illustrated in FIG. 9, a storage battery system 930 is different from storage battery system 130 illustrated in FIG. 1 in that storage battery system 930 cooperates with a management device 900.

Management device 900 is connected to each of the plurality of storage battery units 120 via a communication path. The communication path may be wireless or wired. Management device 900 can acquire state information from each of the plurality of storage battery units 120 and transmit a command to each of the plurality of storage battery units 120 at regular time intervals.

The "state information" herein may include the charge state of each storage battery unit 120, a history of input and output of active power, and the like. The "command" herein includes assignment of a role of each storage battery unit 120, the third threshold value for storage battery unit 120 selected as storage battery unit 120A, setting of active power output from each storage battery unit 120, and the like. Management device 900 can change a type, parameter, and the like of information included in the command on the basis of the state information.

As an example, management device 900 acquires state information from each of the plurality of storage battery units 120, and transmits a command to assign a role to each storage battery unit 120 on the basis of the state information. In the example in FIG. 9, management device 900 selects one of two storage battery units 120 as storage battery unit 120A and selects the other as storage battery unit 120B. Management device 900 may transmit a command to update the third threshold value to storage battery unit 120A on the basis of the state information acquired from selected storage battery unit 120A and/or 120B.

Since storage battery unit 120A is required to instantaneously output large power, management device 900 may select storage battery unit 120 having a relatively small output of the current active power as storage battery unit 120A. When the charge state of storage battery unit 120A becomes 0%, the balance between the power demand and the power supply is greatly lost, and thus, it is desirable that storage battery unit 120 selected as storage battery unit 120A maintains a certain charge state. Therefore, management device 900 assigns the role of storage battery unit 120A to appropriate storage battery unit 120 on the basis of an output state, the charge state, and the like of the active power of each storage battery unit 120.

Management device 900 can select storage battery unit 120B from among storage battery units 120 having a relatively small output of the current active power and maintaining a certain charge state among storage battery units 120 that have not been selected as storage battery unit 120A.

Management device 900 transmits the third threshold value to storage battery unit 120A. When the detected frequency of system 105 falls below the first threshold value, storage battery unit 120A continues to output the active power until the frequency of system 105 reaches the received third threshold value. Management device 900 can determine the setting of the active power output from each of storage battery units 120A and 120B on the basis of the charge state of each of storage battery units 120A and 120B or the current output state of the active power. Management device 900 transmits these settings to each of storage battery units 120A and 120B. Through this processing, management device 900 can manage a total output of the active power of storage battery system 930 as a whole.

In one aspect, management device 900 may manage a plurality of storage battery systems 930. A plurality of management devices 900 may divide and manage the plurality of storage battery systems 930. In that case, a higher-level management device for managing the plurality of management devices 900 may be installed.

In another aspect, management device 900 may select the plurality of storage battery units 120 as storage battery unit 120A, or may select the plurality of storage battery units 120 as storage battery unit 120.

Figure 10:
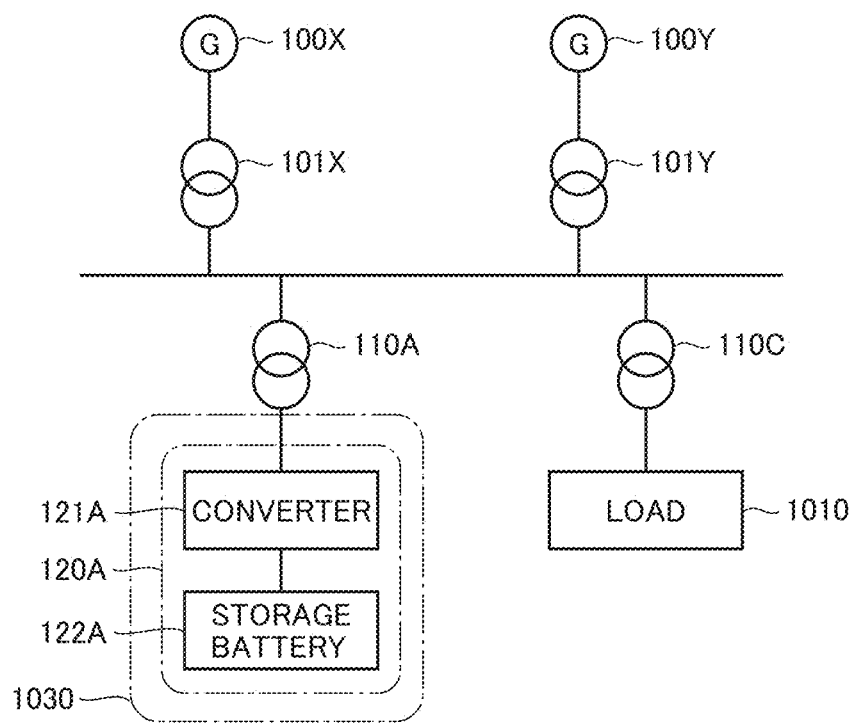
FIG. 10 is a diagram illustrating a third example of a storage battery system according to an embodiment.

FIG. 10 is a diagram illustrating a third example of the storage battery system according to the present embodiment. A storage battery system 1030 in FIG. 10 is different from storage battery systems 130 and 930 in that storage battery system 1030 includes only storage battery unit 120A and does not include storage battery unit 120B. Storage battery system 1030 includes only storage battery unit 120A that outputs constant active power without depending on the frequency of system 105, and thus can suppress vibration and divergence of the frequency of system 105.

As described above, storage battery systems 130, 930, and 1030 according to the present embodiment include at least storage battery 122A that always outputs the constant active power regardless of the fluctuation in the frequency of system 105. In this configuration, storage battery system 130 can suppress vibration and divergence of the frequency of system 105.

Storage battery system 130 in one aspect includes storage battery unit 120A and storage battery unit 120B. When storage battery unit 120A outputs the constant active power, storage battery unit 120B also outputs active power that changes on the basis of the frequency of system 105 and the reference frequency. In this configuration, storage battery system 130 can suppress a sharp decrease and divergence of the frequency of system 105.

Storage battery system 930 in another aspect transmits a command to each storage battery unit 120 on the basis of the state information of each storage battery unit 120 in cooperation with management device 900. In this configuration, management device 900 can select appropriate storage battery unit 120 as storage battery units 120A and 120B.

It should be understood that the embodiment disclosed herein is illustrative in all respects and not restrictive. The scope of the present disclosure is defined not by the above description but by the claims, and is intended to include meanings equivalent to the claims and all modifications within the scope. In addition, the disclosed contents described in the embodiment and the modifications are intended to be implemented alone or in combination as much as possible.

REFERENCE SIGNS LIST

100: generator, 110: transformer, 105: system, 120: storage battery unit, 121: converter, 122: storage battery, 130, 930, 1030: storage battery system, 150: load, 201: controller, 202: circuit, 301: frequency detector, 302: active power command value generator, 303: active power controller, 304: active current controller, 305: processor, 311: interconnection point voltage, 312: frequency of interconnection point, 313: active power command value, 314: active current command value, 315: modulation factor, 316: on-off command, 900: management device

The invention claimed is:

1. A storage battery system comprising a first storage battery unit and a second storage battery unit, wherein
the first storage battery unit includes
a first converter to convert alternating current and direct current,
a first storage battery, and
a first controller to control the first converter,
the first storage battery unit is interconnected to a system for supplying power, and
the first controller
detects a frequency of the system, and
controls the first converter for the first storage battery to output constant active power to the system based on the frequency of the system falling below a first threshold value,
the second storage battery unit includes
a second converter to convert alternating current and direct current,
a second storage battery, and
a second controller to control the second converter,
the second storage battery unit is interconnected to the system, and
the second controller
detects a frequency of the system, and
controls the second converter for the second storage battery to output active power that fluctuates in accordance with a difference between the frequency of the system having been detected and a reference frequency to the system based on the frequency of the system falling below a second threshold value lower than the first threshold value.

2. The storage battery system according to claim 1, wherein
the first controller
determines whether a predetermined period has elapsed from a time point at which the first storage battery starts outputting active power, and
controls the first converter to decrease the active power output from the first storage battery based on the predetermined period having elapsed.

3. The storage battery system according to claim 1, wherein
the first controller
detects the frequency of the system after the first storage battery starts outputting active power, and
controls the first converter to decrease the active power output from the first storage battery based on the frequency of the system being greater or equal to a third threshold value that exceeds the first threshold value.

4. The storage battery system according to claim 1, wherein
the second storage battery based on the frequency of the system to greeter than or equal to the second threshold value.

5. The storage battery system according to claim 1, wherein the second controller controls the second converter to stop the active power output from the second storage battery, before the first controller stops the active power output from the first storage battery.

6. The storage battery system according to claim 4, wherein the second storage battery outputs active power proportional to a deviation between the frequency of the system and the reference frequency.

7. The storage battery system according to claim 4, wherein the second storage battery outputs active power based on a value obtained by proportional integration of a deviation between the frequency of the system and the reference frequency.

8. The storage battery system according to claim 4, further comprising a management device to communicate with a plurality of storage battery units interconnected to the system, wherein
the management device
transmits a first instruction to a storage battery unit selected from among the plurality of storage battery units interconnected to the system so as to operate the storage battery unit as the first storage battery unit, and
transmits a second instruction to another storage battery unit selected from among the plurality of storage battery units interconnected to the system so as to operate the another storage battery unit as the second storage battery unit.

9. The storage battery system according to claim 8, wherein the management device selects the storage battery unit to be operated as the first storage battery unit and the storage battery unit to be operated as the second storage battery unit from among the plurality of storage battery units interconnected to the system based on a charge state of each of the plurality of storage battery units interconnected to the system.

10. The storage battery system according to claim 8, wherein the management device selects the storage battery unit to be operated as the first storage battery unit and the storage battery unit to be operated as the second storage battery unit from among the plurality of storage battery units interconnected to the system based on active power output from each of the plurality of storage battery units interconnected to the system.

11. The storage battery system according to claim 8, wherein the management device transmits, to the first storage battery unit, an instruction to set a value of active power output from the first storage battery.

12. The storage battery system according to claim 11, wherein the management device determines the value of active power output from the first storage battery based on a charge state of the first storage battery.

13. A method for suppressing a fluctuation in a frequency of a system of alternating current power, the method comprising:
  detecting the frequency of the system;
  outputting constant active power from a first storage battery unit interconnected to the system to the system based on the frequency of the system falling below a first threshold value; and
  outputting active power that fluctuates in accordance with a difference between the frequency of the system having been detected and a reference frequency from a second storage battery unit interconnected to the system to the system based on the frequency of the system falling below a second threshold value lower than the first threshold value.

14. The method according to claim 13, further comprising:
  determining whether a predetermined period has elapsed from a time point at which the first storage battery unit starts outputting active power, and
  decreasing the active power output from the first storage battery unit based on the predetermined period having elapsed.

15. The method according to claim 13, further comprising:
  detecting the frequency of the system after the first storage battery unit starts outputting active power, and
  decreasing the active power output from the first storage battery unit based on the frequency of the system being greater or equal to a third threshold value that exceeds the first threshold value.

16. The method according to claim 13, further comprising stopping the active power output from the second storage battery based on the frequency of the system being greater than or equal to the second threshold value.

17. The method according to claim 13, further comprising stopping the active power output from the second storage battery unit before the active power output from the first storage battery unit is stopped.

18. The method according to claim 16, wherein the second storage battery unit outputs active power proportional to a deviation between the frequency of the system and the reference frequency.

19. The method according to claim 16, wherein the second storage battery unit outputs active power based on a value obtained by proportional integration of a deviation between the frequency of the system and the reference frequency.

20. The method according to claim 16, further comprising:
  transmitting a first instruction to a storage battery unit selected from among a plurality of storage battery units interconnected to the system so as to operate the storage battery unit as the first storage battery unit; and
  transmitting a second instruction to another storage battery unit selected from among the plurality of storage battery units interconnected to the system so as to operate the another storage battery unit as the second storage battery unit.

* * * * *